(12) United States Patent
Kobayashi et al.

(10) Patent No.: US 7,876,138 B2
(45) Date of Patent: Jan. 25, 2011

(54) DLL CIRCUIT AND SEMICONDUCTOR DEVICE HAVING THE SAME

(75) Inventors: Shotaro Kobayashi, Tokyo (JP); Katsuhiro Kitagawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 129 days.

(21) Appl. No.: 12/292,957

(22) Filed: Dec. 1, 2008

(65) Prior Publication Data
US 2010/0123495 A1 May 20, 2010

(30) Foreign Application Priority Data
Nov. 17, 2008 (JP) .............................. 2008-292940

(51) Int. Cl.
*H03L 7/06* (2006.01)
(52) U.S. Cl. ....................................... 327/158; 327/149
(58) Field of Classification Search ................. 327/149, 327/158
See application file for complete search history.

(56) References Cited

U.S. PATENT DOCUMENTS

| 7,046,060 B1 * | 5/2006 | Minzoni et al. ............ 327/158 |
| 7,336,752 B2 * | 2/2008 | Vlasenko et al. ............ 375/376 |
| 7,592,846 B2 * | 9/2009 | Mehas et al. ................. 327/158 |
| 7,724,051 B2 * | 5/2010 | Tomar et al. ................. 327/158 |
| 2004/0125905 A1 * | 7/2004 | Vlasenko et al. ............ 375/376 |
| 2009/0189658 A1 * | 7/2009 | Tomar et al. ................. 327/158 |
| 2010/0102862 A1 * | 4/2010 | Takahashi et al. ........... 327/158 |
| 2010/0201413 A1 * | 8/2010 | Miyano ....................... 327/158 |
| 2010/0213991 A1 * | 8/2010 | Fukuda ....................... 327/117 |

* cited by examiner

*Primary Examiner*—Lincoln Donovan
*Assistant Examiner*—Adam D Houston
(74) *Attorney, Agent, or Firm*—McGinn IP Law, PLLC

(57) ABSTRACT

A DLL circuit includes a delay line that generates an internal clock signal by delaying an external clock signal CLK, a counter circuit that sets a delay amount of the delay line, a phase detecting circuit that generates a phase determination signal based on a phase of the external clock signal, and an antialiasing circuit that prohibits the counter circuit to update a count value based on the phase determination signal, in response to a fact that a jitter component included in the external clock signal is equal to or higher than a predetermined frequency. With this configuration, a problem that the internal clock signal is continuously controlled to a wrong direction due to malfunction of aliasing does not occur.

16 Claims, 6 Drawing Sheets

DLL CIRCUIT AND SEMICONDUCTOR DEVICE HAVING THE SAME

BACKGROUND OF THE INVENTION

1. Field of the Invention

The present invention relates to a DLL circuit and a semiconductor device including the same, and more particularly relates to a DLL circuit suitable for application when a clock signal includes a jitter component, and a semiconductor device including the DLL circuit.

2. Description of Related Art

In recent years, a synchronous memory operating synchronously with a clock is widely used as a main memory of a personal computer or the like. Among synchronous memories, a DDR (Double Data Rate) synchronous memory needs to accurately synchronize input and output data with an external clock signal. Therefore, a DLL circuit for generating an internal clock synchronous with the external clock signal is essential (Japanese Patent Application Laid-open No. 2008-217947).

The external clock signal sometimes includes a jitter component. The jitter component is a fluctuation of a clock frequency, and the fluctuation has a predetermined frequency. Therefore, when the external clock signal includes a jitter component, the DLL circuit needs to cause the internal clock signal to follow the jitter of the external clock signal.

However, due to a sampling principle, an adjustment frequency of an internal clock signal, that is, a frequency exceeding a half of a sampling frequency cannot be regenerated. This means that when a jitter component included in the external clock signal exceeds one half of the sampling frequency, an internal clock signal generated by the DLL circuit cannot be caused to follow the jitter.

Further, when the jitter component exceeds one half of the sampling frequency, aliasing is generated. When the jitter component is close to an integral multiple of the sampling frequency, the DLL circuit continuously controls the internal clock signal to a wrong direction. Consequently, there was a problem that a phase of the internal clock signal is deviated greatly from a desired phase.

FIG. 6 is a waveform diagram for explaining a phenomenon that an internal clock is continuously controlled to a wrong direction.

In the example shown in FIG. 6, when a sampling frequency is $f_S$ and also when a jitter frequency is $f_J$, $f_J > f_S/2$ is obtained. Further, the sampling frequency $f_S$ and the jitter frequency $f_J$ are close to each other. In this case, a "phase delay" is determined continuously from sampling points S1 to S12, and a "phase advance" is determined continuously from a sampling point S13 until a sampling point (not shown). However, as shown in FIG. 6, a jitter component of about 11 cycles appears during an actual sampling period from the sampling points S1 to S12, and the determination of the "phase delay" for 12 consecutive times is wrong. This similarly applies to determination for the sampling point S13 and after, and the determination of the "phase advance" for a plurality of consecutive times is wrong. When the malfunction occurs, the DLL circuit continuously controls a control direction of the internal clock signal to a wrong direction. As a result, the phase is deviated greatly from a desired phase.

To solve the above problem, it is effective to take a high sampling frequency. However, adjustment of the internal clock signal requires a certain level of time, and therefore there is a limit to the sampling frequency. There is also a problem that, when the sampling frequency is set high, power consumption increases.

SUMMARY OF THE INVENTION

As explained above, according to conventional DLL circuits, it is difficult to prevent the occurrence of malfunction due to aliasing without increasing power consumption. Therefore, a DLL circuit capable of preventing the occurrence of malfunction due to aliasing while restricting the increase of power consumption has been desired.

A DLL circuit according to the present invention includes: a first delay line generating a second clock signal by delaying a first clock signal; a first counter circuit setting a delay amount of the first delay line; a phase detecting circuit generating a phase determination signal based on a phase of the first clock signal; and an antialiasing circuit prohibiting the first counter circuit to update a count value based on the phase determination signal, in response to a fact that a jitter component included in the first clock signal is a predetermined frequency or more.

A semiconductor device according to the present invention includes: the above DLL circuit: an output buffer outputting an external output signal synchronously with the second clock signal; and a replica buffer having substantially the same circuit configuration as that of the output buffer, and outputting a third clock signal synchronously with the second clock signal, wherein the phase detecting circuit determines a phase of the first clock signal by comparing the first clock signal and the third clock signal.

As explained above, according to the present invention, the counter circuit is prohibited to perform an update when a condition having a possibility of generating malfunction due to the aliasing is detected. Therefore, a problem that the second clock signal output from the DLL circuit is continuously controlled in a wrong direction goes away without increasing of a sampling frequency. Further, when the counter circuit is prohibited to perform the update, power consumption due to updating is not generated. Consequently, total power consumption can be decreased.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
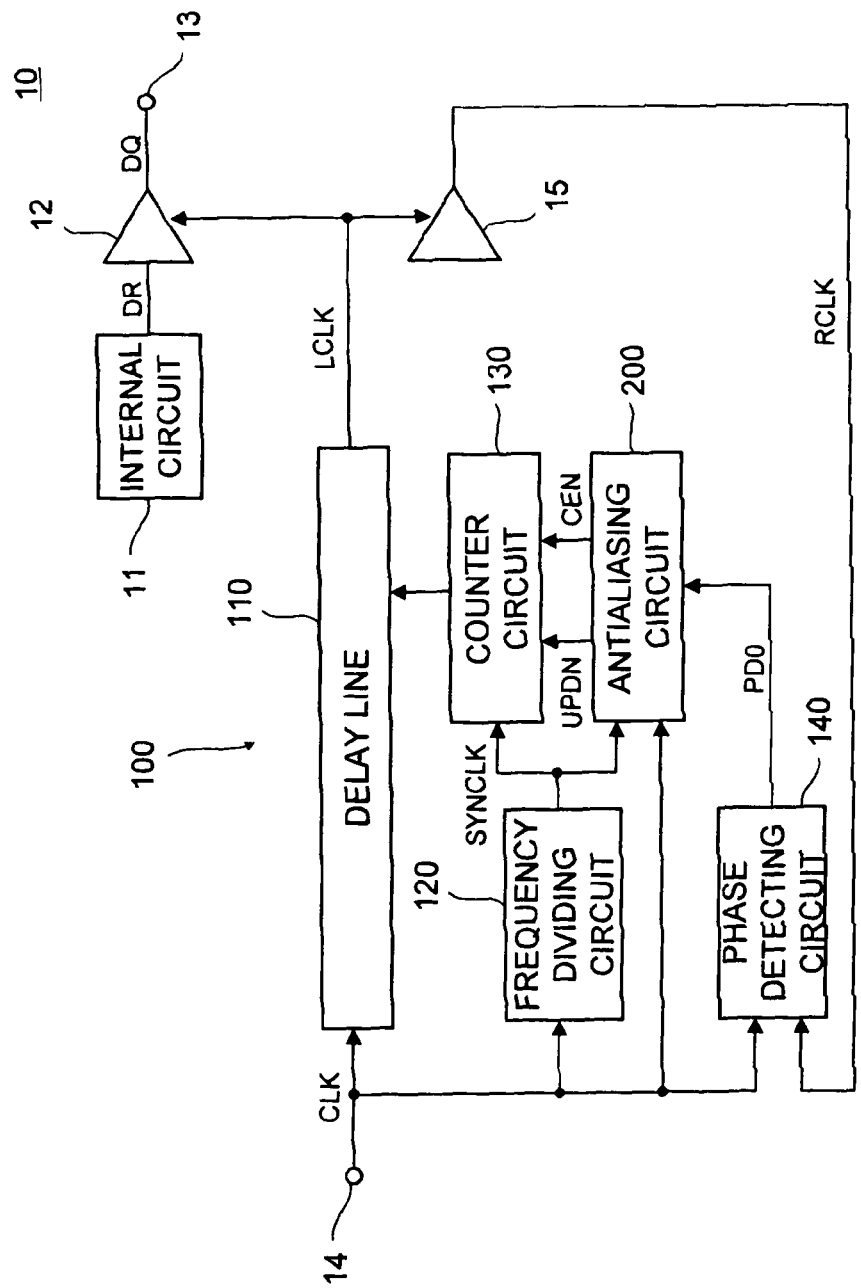
FIG. 1 is a block diagram showing a configuration of a semiconductor device 10 according to a first embodiment of the present invention.

FIG. 1 is a block diagram showing a configuration of a semiconductor device 10 according to a first embodiment of the present invention.

As shown in FIG. 1, the semiconductor device 10 according to the first embodiment includes an internal circuit 11 that outputs an internal output signal DR, an output buffer 12 that outputs an external output signal DQ based on the internal output signal DR, and a DLL circuit 100 that controls an operation timing of the output buffer 12. The internal circuit 11 is different depending on a kind of the semiconductor device 10. For example, when the semiconductor device 10 according to the first embodiment is a DRAM, the internal circuit 11 includes a memory cell array, a column switch, a read amplifier or the like.

The output buffer 12 is a circuit that outputs the external output signal DQ to the outside via an output terminal 13. An output timing of the external output signal DQ needs to be synchronous with an external clock signal CLK (a first clock signal) input via a clock terminal 14. An operation timing of the output buffer 12 is controlled by the DLL circuit 100. A configuration of the DLL circuit is explained in detail below.

As shown in FIG. 1, the DLL circuit 100 includes a delay line 110, a frequency dividing circuit 120, a counter circuit 130, a phase detecting circuit 140, and an antialiasing circuit 200.

The delay line 110 is a circuit that generates an internal clock signal LCLK (a second clock signal) by delaying the external clock signal CLK. While not particularly limited, the delay line 110 preferably includes a coarse delay line that delays the external clock signal at a relatively coarse adjustment pitch, and a fine delay line that delays the external clock signal at a relatively fine adjustment pitch.

As shown in FIG. 1, the internal clock signal LCLK is supplied to the output buffer 12 and a replica buffer 15. The output buffer 12 is a circuit that receives the internal output signal DR supplied from the internal circuit 11, and supplies the signal to the output terminal 13 as the external output signal DQ, as described above. On the other hand, the replica buffer 15 is a circuit that has substantially the same circuit configuration as that of the output buffer 12, and outputs a replica clock signal RCLK (a third clock signal) synchronously with the internal clock signal LCLK. With this configuration, a phase of the replica clock signal RCLK correctly coincides with a phase of the external output signal DQ. However, a size of a transistor constituting the replica buffer 15 does not need to be the same as that of a transistor constituting the output buffer 12. A shrunk transistor can be used for the transistor constituting the replica buffer 15, so long as impedances are substantially the same.

The frequency dividing circuit 120 is a circuit that generates a sampling clock signal SYNCLK by dividing the external clock signal CLK. The sampling clock SYNCLK is supplied to the counter circuit 130 and the antialiasing circuit 200, and is used as a synchronization signal indicating a sampling timing. The frequency dividing circuit 120 is used because the update by the counter circuit 130 and the change of a delay amount by the delay line 110 require a certain period of time, and also because it is difficult for the counter circuit 130 to perform the update and for the delay line 110 to update the delay amount at each cycle of the external clock signal CLK. Further, when the update of the counter circuit 130 and the change of the delay amount of the delay line 110 are frequently performed more than necessary, power consumption increases substantially. While not particularly limited, in the first embodiment, a frequency number N of the frequency dividing circuit 120 is set to 8. That is, when a frequency of the external clock signal CLK is $f_{CLK}$, and also when a frequency of the sampling clock signal SYNCLK, namely a sampling frequency, is $f_S$, $f_S = f_{CLK}/8$ is obtained.

The counter circuit 130 sets a delay amount of the delay line 110, and updates a count value synchronously with the sampling clock signal SYNCLK. Increase or decrease of the count value is determined based on an up/down signal UPDN supplied from the antialiasing circuit 200. That is, when the up/down signal UPDN indicates up-count, the counter circuit 130 up-counts the count value synchronously with the sampling clock signal SYNCLK, thereby increasing the delay amount of the delay line 110. On the other hand, when the up/down signal UPDN indicates down-count, the counter circuit 130 down-counts the count value synchronously with the sampling clock signal SYNCLK, thereby decreasing the delay amount of the delay line 110.

The counter circuit 130 is permitted or prohibited to update the count value by a counter enable signal CEN supplied from the antialiasing circuit 200. That is, even when an active edge of the sampling clock signal SYNCLK appears, update of the count value is prohibited when the counter enable signal CEN is in a disable state. Therefore, update of the count value is permitted when the active edge of the sampling clock signal SYNCLK appears, and is limited to a case where the counter enable signal CEN is in the enable state.

The phase detecting circuit 140 detects a difference between a phase of the external clock signal CLK and a phase of the replica clock signal RCLK. As described above, the delay line 110 adjusts a phase of the replica clock signal so that the phase coincides with a phase of the external output signal DQ. However, both phases always change based on a variation of parameters such as a voltage and a temperature affecting a delay amount of the delay line 110, and based on a variation of a frequency of the external clock signal CLK itself. The phase detecting circuit 140 detects the change, and determines whether the replica clock signal RCLK is advanced or delayed from the external clock signal CLK. The phase detecting circuit 140 performs the determination at each cycle of the external clock signal CLK, and supplies a determination result to the antialiasing circuit 200 as a phase determination signal PD0. The phase determination signal PD0 is used for the counter circuit 130 to update the count value.

The antialiasing circuit 200 receives the external clock signal CLK, the sampling clock signal SYNCLK, and the phase determination signal PD0, and generates the up/down signal UPDN and the counter enable signal CEN based on these received signals.

A basic operation of the antialiasing circuit 200 is as follows. The antialiasing circuit 200 monitors the phase determination signal PD0 during one sampling cycle. When the antialiasing circuit 200 determines that the replica clock signal RCLK is advanced as a result of the monitoring, the circuit sets the up/down signal UPDN to an up-count state, thereby increasing a delay amount of the delay line 110. On the other hand, when the antialiasing circuit 200 determines that the replica clock signal RCLK is delayed as a result of the monitoring, the circuit sets the up/down signal UPDN to a down-count state, thereby decreasing a delay amount of the delay line 110. Further, the antialiasing circuit 200 determines whether a jitter component included in the external clock signal CLK is equal to or higher than a predetermined frequency. When a frequency of the jitter is lower than a predetermined frequency as the determination result, the antialiasing circuit 200 sets the counter enable signal CEN to an enable state. On the other hand, when a frequency of the jitter is equal to or higher than a predetermined frequency as the determination result, the antialiasing circuit 200 sets the counter enable signal CEN to a disable state.

Based on the above operation, the counter circuit 130 is prohibited to perform the update when the jitter component included in the external clock signal CLK is equal to or higher than a predetermined frequency. The antialiasing circuit 200 is explained in detail below.

Figure 2:
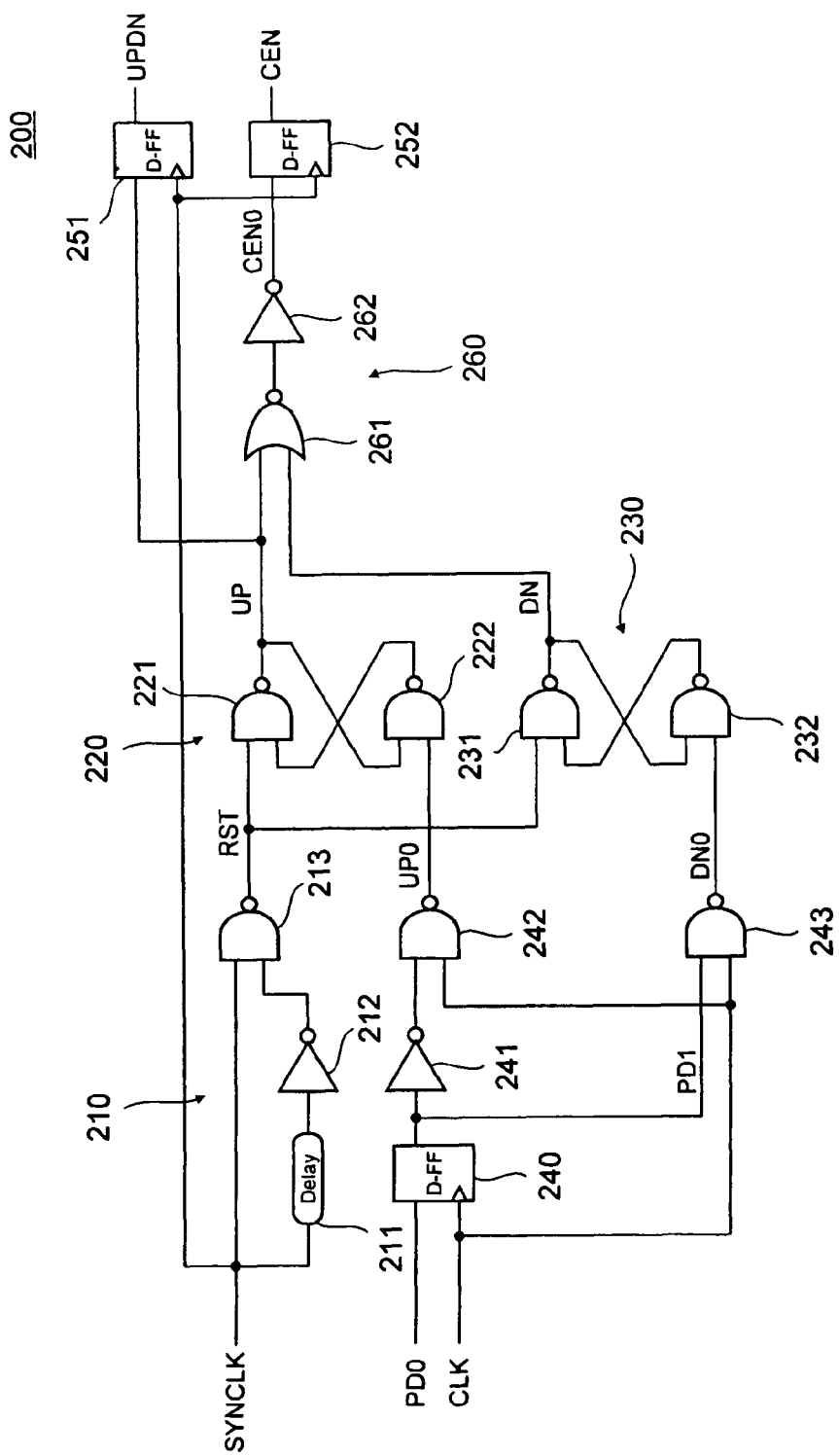
FIG. 2 is a circuit diagram of the antialiasing circuit 200.

FIG. 2 is a circuit diagram of the antialiasing circuit 200.

As shown in FIG. 2, the antialiasing circuit 200 has a reset pulse generating unit 210 that generates a reset pulse RST in response to a rising edge of the sampling clock signal SYN-CLK. The reset pulse generating unit 210 includes a delay element 211, an inverter 212, and a NAND circuit 213. The reset pulse generated by the reset pulse generating unit 210 is supplied in common to a reset input terminal of SR latches 220 and 230.

The SR latch 220 has a configuration having NAND circuits 221 and 222 connected in circulation. An up-count signal UP0 generated by a D-F/F circuit 240, an inverter 241, and a NAND circuit 242 is supplied to a set input terminal of the SR latch 220. The D-F/F circuit 240 latches the phase determination signal PD0 synchronously with the external clock signal CLK.

The SR latch 230 has a configuration having NAND circuits 231 and 232 connected in circulation. A down-count signal DN0 generated by the D-F/F circuit 240 and a NAND circuit 243 is supplied to a set input terminal of the SR latch 230.

An output UP of the SR latch 220 is supplied to a D-F/F circuit 251, and an output of the D-F/F circuit 251 is used as the up/down signal UPDN. The D-F/F circuit 251 latches an output of the SR latch 220 synchronously with the sampling clock signal SYNCLK.

Further, outputs UP and DN of the SR latches 220 and 230 are supplied to an OR circuit 260 that includes an NOR circuit 261 and an inverter 262. An output CEN0 of the OR circuit 260 is supplied to a D-F/F circuit 252. An output of the D-F/F circuit 252 is used as the counter enable signal CEN. The D-F/F circuit 252 latches the output CEN0 of the OR circuit 260 synchronously with the sampling clock signal SYNCLK.

When the reset pulse RST is activated based on the above circuit configuration, the SR latches 220 and 230 are reset. As a result, the counter enable signal CEN becomes at a high level (an enable state), regardless of a level of the phase determination signal PD0. On the other hand, one of the SR latches 220 and 230 is set according to a level of the phase determination signal PD0. Therefore, a level of the up/down signal UPDN is determined according to the set. When a logic level of the phase determination signal PD0 changes during the same sampling period, both SR latches 220 and 230 are set. Therefore, the counter enable signal CEN changes to a low level (a disable state).

As explained above, when the phase determination signal PD0 changes during the same sampling period, the antialiasing circuit 200 operates to disable the counter enable signal CEN. Next, the operation of the antialiasing circuit 200 is explained in further detail with reference to a timing chart.

Figure 3:
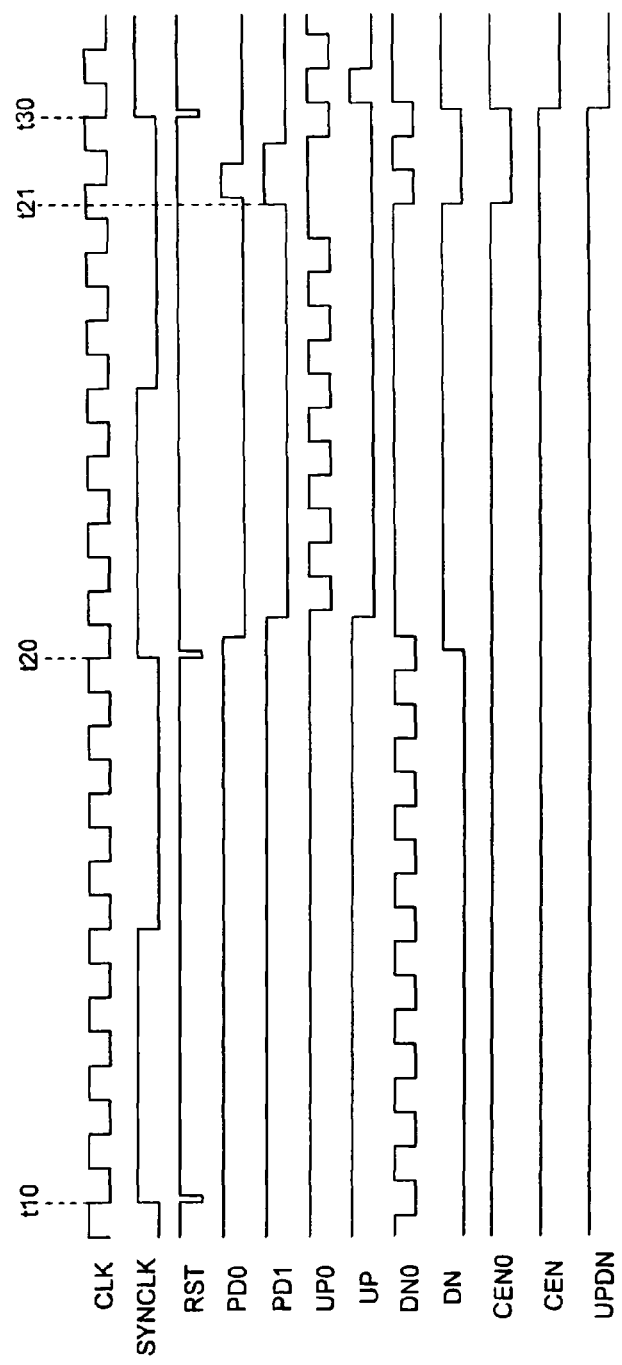
FIG. 3 is a timing chart for explaining the operation of the antialiasing circuit 200.

FIG. 3 is a timing chart for explaining the operation of the antialiasing circuit 200.

As shown in FIG. 3, the antialiasing circuit 200 activates the reset pulse RST at each eight cycles of the external clock signal CLK. This is because the sampling clock signal SYN-CLK is a signal obtained by eight-frequency dividing the external clock signal CLK. In the example shown in FIG. 3, after the sampling clock signal SYNCLK is activated at a time t10, the phase determination signal PD0 is at a high level when a first active edge of the external clock signal CLK arrives. Therefore, the up-count signal UP0 is fixed to a high level, and the down-count signal DN0 clocks. As a result the SR latch 220 holds a reset state, and the SR latch 230 is set. Therefore, the up/down signal UPDN becomes at a high level, and the counter enable signal CEN also becomes at a high level. Consequently, the counter circuit 130 is permitted to perform the update operation at a time t20, and the counter circuit 130 performs the up-count.

When the next sampling clock signal SYNCLK is activated at the time t20, the SR latches 220 and 230 are reset again. After the sampling clock signal SYNCLK is activated at the time t20, the phase determination signal PD0 is at a low level when a first active edge of the external clock signal CLK arrives. Therefore, the down-count signal DN0 is fixed to a high level, and the up-count signal UP0 clocks. As a result, the SR latch 230 holds a reset state, and the SR latch 220 is set. However, in the example shown in FIG. 3, a level of the phase determination signal PD0 changes at a time t21 before a time t30 when the next sampling clock signal SYNCLK is activated. Consequently, the counter enable signal CEN becomes at a low level, and the counter circuit 130 is prohibited to perform the update operation at the time t30.

As explained above, when a logic level of the phase determination signal PD0 does not change during a sampling period, that is, when the phase determination signal PD0 does not change during eight cycles of the external clock signal, the antialiasing circuit 200 sets the counter enable signal CEN to an enable state. On the other hand, when a logic level of the phase determination signal PD0 changes during a sampling period, the antialiasing circuit 200 sets the counter enable signal CEN to a disable state. That a logic level of the phase determination signal PD0 does not change during a sampling period means that the frequency $f_J$ of the jitter is equal to or smaller than one half of the sampling frequency $f_S$ even when the external clock signal CLK includes the jitter.

Figure 4:
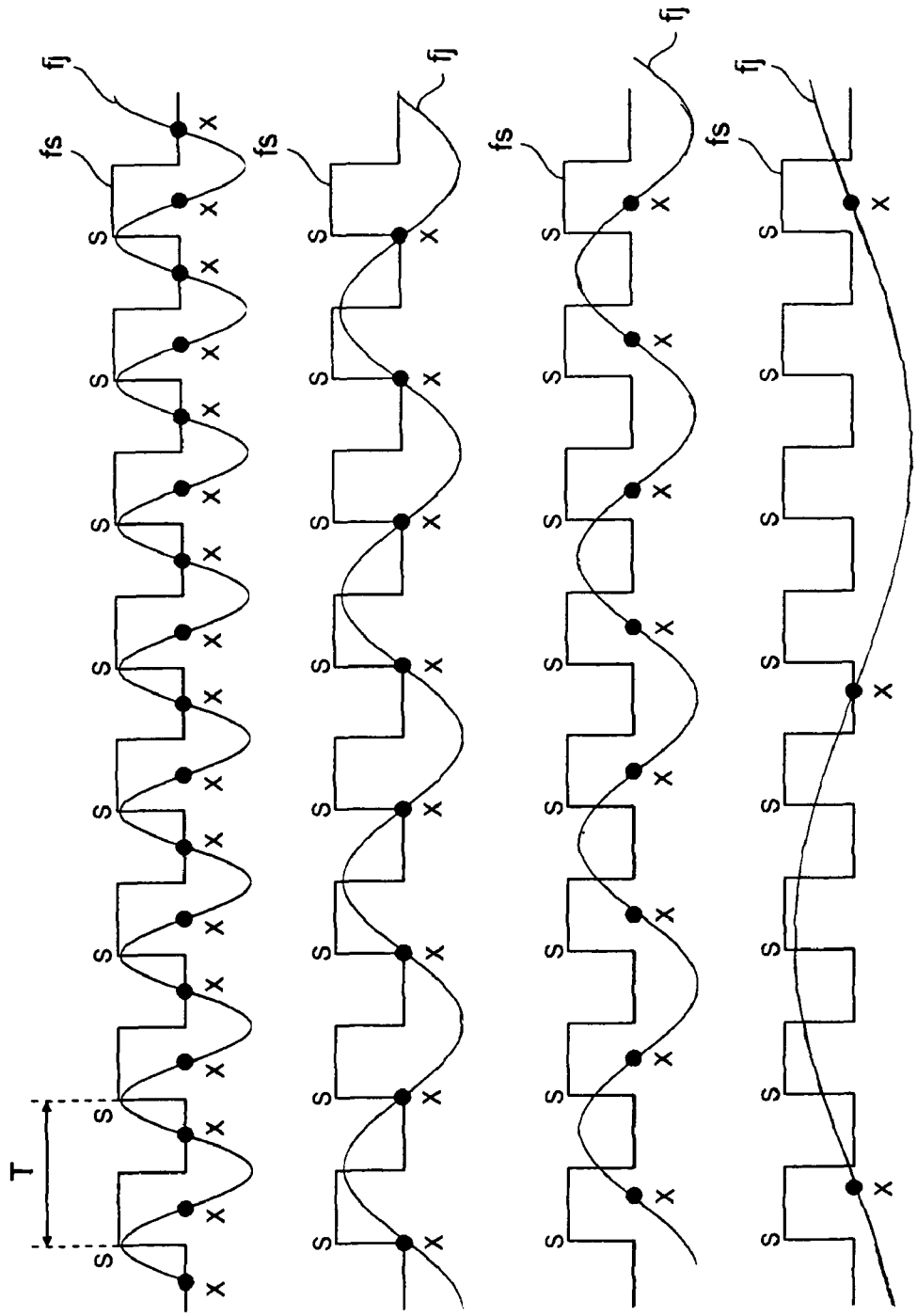
FIG. 4A shows a relationship between the frequency $f_J$ of the jitter and the sampling frequency $f_S$ when $f_J > f_S/2$.
FIG. 4B and FIG. 4C show a relationship between the frequency $f_J$ of the jitter and the sampling frequency $f_S$ when $f_J = f_S/2$.
FIG. 4D shows a relationship between the frequency $f_J$ of the jitter and the sampling frequency $f_S$ when $f_J < f_S/2$.

FIG. 4A to FIG. 4D show a relationship between the frequency $f_J$ of the jitter and the sampling frequency $f_S$, where FIG. 4A shows a relationship of $f_J > f_S/2$, FIG. 4B and FIG. 4C show a relationship of $f_J = f_S/2$, and FIG. 4D shows a relationship of $f_J < f_S/2$.

As shown in FIG. 4A, when $f_J > f_S/2$, change points X of a delay and an advance of the external clock signal CLK due to a jitter component are included in all sampling cycles T without exception. A jitter component of this frequency cannot be followed based on a sampling principle. Therefore, the antialiasing circuit 200 interrupts the jitter component.

Meanwhile, as shown in FIG. 4B and FIG. 4C, when $f_J = f_S/2$, an appearance cycle of the change points X and the sampling cycle coincide with each other. Therefore, when the jitter has a phase as shown in FIG. 4B, each change point X and the sampling point S coincide with each other. When the jitter has a phase as shown in FIG. 4C, the change points X are included in all sampling cycles.

On the other hand, as shown in FIG. 4D, when $f_J < f_S/2$, both a sampling cycle including the change point X and a sampling cycle not including the change point X are present in a mix without exception. Therefore, the counter circuit 130 is permitted to perform the update during a sampling cycle not including the change point X, and is prohibited to perform the update during a period including the change point X.

Figure 6:
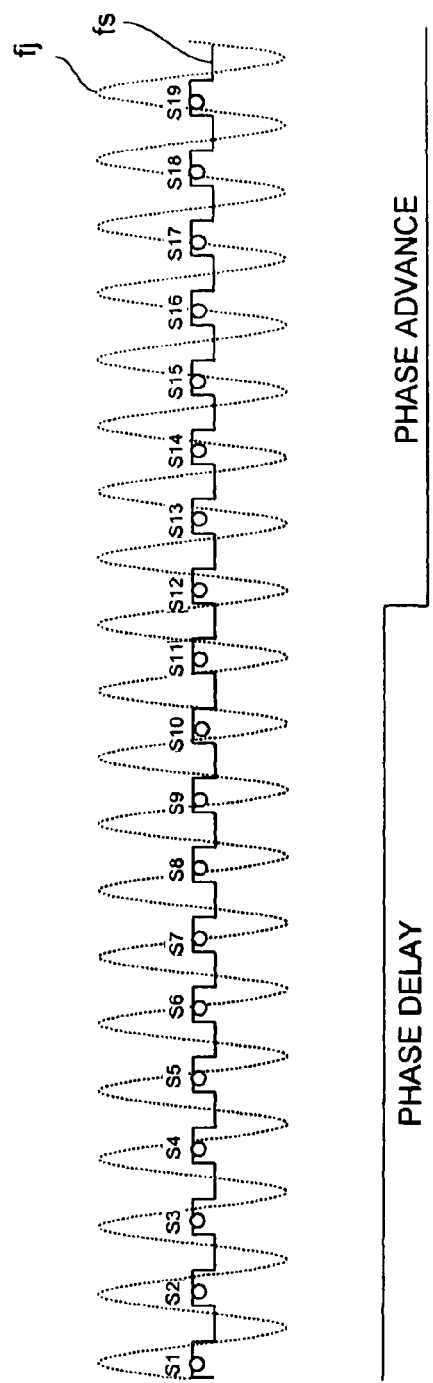
FIG. 6 is a waveform diagram for explaining a phenomenon that an internal clock is continuously controlled to a wrong direction.

As explained above, when the external clock signal CLK includes a jitter component that the DLL circuit 100 cannot follow, the counter circuit 130 is prohibited to perform the update. Therefore, a malfunction due to the aliasing as shown in FIG. 6 can be prevented.

However, as shown in FIG. 4D, even when the frequency $f_J$ of the jitter is equal to or smaller than one half of the sampling frequency $f_S$, the change point X occurs in some sampling cycle without exception. Therefore, the counter circuit 130 is prohibited to perform the update in this sampling cycle. The sampling cycle occurs frequently when the frequency $f_J$ of the jitter is closer to one half of the sampling frequency $f_S$. In this case, the counter circuit 130 is frequently prohibited to perform the update. Even in this case, the DLL circuit 100 can correctly hold a lock state. When this becomes a problem according to the type of application, the antialiasing circuit 200 can be configured to permit the counter circuit 130 to perform the update in a predetermined case even when the phase determination signal PD0 changes within the same sampling cycle.

Specifically, the counter circuit 130 can be permitted to perform the update when the phase determination signal PD0 during a sampling period keeps the same value at more than N/2 times consecutively. The N is a frequency dividing number of the frequency dividing circuit 120, and it is 8 in the first embodiment. Therefore, in this case, when the phase determination signal PD0 is the same value at five or more times consecutively, the counter circuit 130 is permitted to perform the update. Similarly, when the frequency dividing number N of the frequency dividing circuit 120 is 16, and also when the phase determination signal PD0 is the same value at nine or more times consecutively, the counter circuit 130 is permitted to perform the update. Accordingly, the counter circuit 130 can frequently perform the update while preventing malfunction due to the aliasing to some extent. On the other hand, when the phase determination signal PD0 is the same value at less than N/2 times consecutively during a sampling period, the counter circuit 130 should not be permitted to perform the update. In this case, when the counter circuit 130 is permitted to perform the update in this case, aliasing cannot be sufficiently removed.

Further, due to noise or the like, the phase determination signal PD0 can be at a different logic level only once during the same sampling period. Therefore, when the counter circuit 130 is prohibited to perform the update in this case, it can become susceptible to noise. To solve this problem, when the phase determination signal PD0 is at a different logic level only once during the same sampling period, this can be regarded as noise and ignored. That is, when the frequency dividing number N is 8, and also when the phase determination signal PD0 has the same value at seven or more times, the counter circuit 130 can be permitted to perform the update, regardless of whether the same value is consecutive or non-consecutive. Similarly, when the frequency dividing number N is 16, and also when the phase determination signal PD0 has the same value at 15 or more times, the counter circuit 130 can be permitted to perform the update, regardless of whether the same value is consecutive or non-consecutive.

When the frequency dividing number N is large, this can be also regarded as noise and ignored, when the phase determination signal PD0 is at a different logic level only at two times (or more). For example, when the frequency dividing number N is 16, and also when the phase determination signal PD0 has the same value at 14 or more times, the counter circuit 130 can be permitted to perform the update, regardless of whether the same value is consecutive or non-consecutive. When the frequency dividing number N is 32, and also when the phase determination signal PD0 has the same value at 30 or more times, the counter circuit 130 can be permitted to perform the update, regardless of whether the same value is consecutive or non-consecutive. When the phase determination signals PD0 becoming at different logic levels at two or more times are to be ignored, it is preferable to ignore these phase determination signals PD0 subject to a condition that these phase determination signals PD0 are generated discontinuously. This is because an inversion of the phase determination signal PD0 due to noise is supposed to occur irregularly.

On the other hand, when the influence of the jitter needs to be more securely excluded, the phase determination signal PD0 is monitored during a period exceeding the sampling cycle. When the phase determination signal PD0 does not change during this period, the counter enable signal CEN is set to an enable state. Accordingly, while a condition for the counter enable signal CEN to become the enable state becomes severer, a lower frequency jitter component can be removed.

As explained above, according to the first embodiment, because the jitter that cannot be regenerated due to the sampling principle is interrupted, an error of the internal clock signal LCLK output from the DLL circuit 100 can be decreased without increasing the sampling frequency. Further, because the counter circuit 130 does not unnecessarily perform the update, power consumption can be decreased.

A second embodiment of the present invention is explained next.

Figure 5:
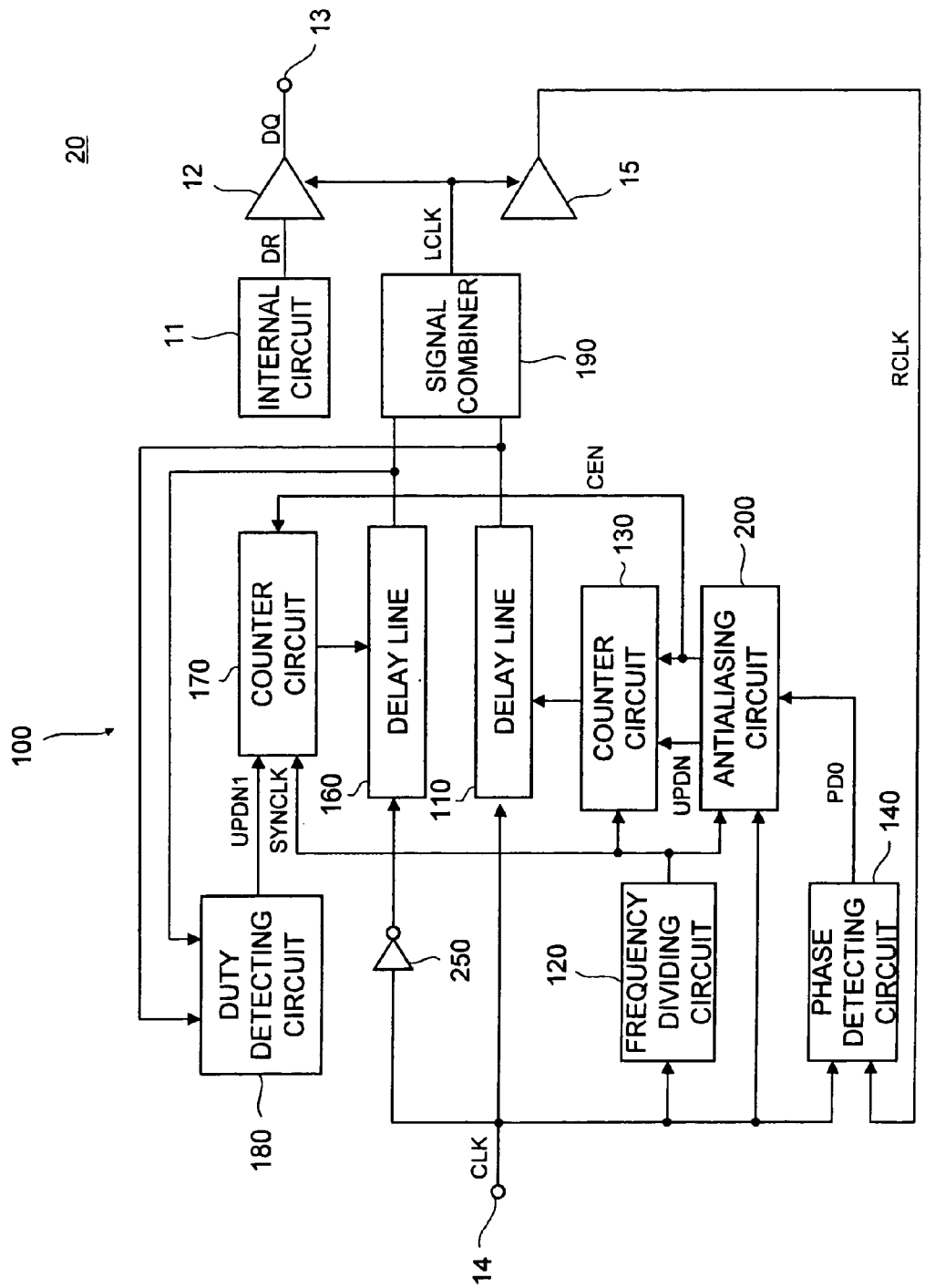
FIG. 5 is a block diagram of a configuration of a semiconductor device 20 according to the second embodiment.

FIG. 5 is a block diagram of a configuration of a semiconductor device 20 according to the second embodiment.

As shown in FIG. 5, the semiconductor device 20 according to the second embodiment further includes a delay line 160, a counter circuit 170, and a duty detecting circuit 180. A signal combiner 190 combines outputs of the two delay lines 110 and 160, thereby generating the internal clock signal LCLK. Other features of the semiconductor device are basically the same to those of the semiconductor device 10 according to the first embodiment, and therefore like elements are denoted by like reference numerals and redundant explanations thereof will be omitted.

The delay line 160 and the counter circuit 170 constitute a duty correction circuit that corrects a duty of the external clock signal CLK inverted by an inverter 250. Specifically, the delay line 160 adjusts a duty of the internal clock signal LCLK by adjusting a position of a falling edge of the external clock signal CLK. The counter circuit 170 determines the adjustment amount. On the other hand, the delay line 110 adjusts a position of a rising edge of the external clock signal CLK, thereby adjusting a phase of the internal clock signal LCLK. As a result, both the phase and the duty of the internal clock signal LCLK generated by the signal combiner 190 are correctly adjusted.

The counter circuit 170 sets a delay amount of the delay line 160, and updates a count value synchronously with the sampling clock signal SYNCLK. Increase and decrease of the count value are determined based on an up/down signal UPDN1 supplied from the duty detecting circuit 180. That is, when the up/down signal UPDN1 indicates up-count, the counter circuit 170 up-counts a count value synchronously with the sampling clock signal SYNCLK, thereby increasing a delay amount of the delay line 160. On the other hand, when the up/down signal UPDN1 indicates down-count, the counter circuit 170 down-counts a count value synchronously with the sampling clock signal SYNCLK, thereby decreasing a delay amount of the delay line 160.

The duty detecting circuit 180 detects a duty of the internal clock signal LCLK based on the delay lines 110 and 160.

The counter circuit 170 is permitted or prohibited to update a count value based on the counter enable signal CEN supplied from the antialiasing circuit 200. That is, when the counter enable signal CEN becomes in a disable state, not only the counter circuit 130 but also the counter circuit 170 is prohibited to update a count value. As a result, also in a duty adjusting side, a problem that a duty is continuously adjusted in a wrong direction due to the influence of the jitter that cannot be followed goes away.

It is apparent that the present invention is not limited to the above embodiments, but may be modified and changed without departing from the scope and spirit of the invention.

What is claimed is:

1. A DLL circuit comprising:
   a first delay line delaying a first clock signal to generate a second clock signal;
   a first counter circuit setting a delay amount of the first delay line;
   a phase detecting circuit generating a phase determination signal based on a phase of the first clock signal; and
   an antialiasing circuit prohibiting the first counter circuit to update its count value based on the phase determination signal, in response to a fact that a jitter component included in the first clock signal is a predetermined frequency or more.

2. The DLL circuit as claimed in claim 1, wherein the antialiasing circuit determines whether the first counter circuit can update its count value, based on the phase determination signal.

3. The DLL circuit as claimed in claim 2, further comprising a frequency dividing circuit generating a sampling clock signal by N-frequency dividing the first clock signal, wherein
   the first counter circuit updates its count value synchronously with the sampling clock signal, and
   the antialiasing circuit determines whether the first counter circuit can update its count value, based on at least a part of the phase determination signal during one cycle of the sampling clock signal.

4. The DLL circuit as claimed in claim 3, wherein the antialiasing circuit permits the first counter circuit to update its count value, in response to a fact that the phase determination signal during one cycle of the sampling clock signal is a same value at more than N/2 times consecutively.

5. The DLL circuit as claimed in claim 3, wherein the antialiasing circuit permits the first counter circuit to update its count value, in response to a fact that the phase determination signal during one cycle of the sampling clock signal is all at the same value.

6. The DLL circuit as claimed in claim 3, wherein the antialiasing circuit permits the first counter circuit to update its count value, in response to a fact that the phase determination signal is at the same value during a period exceeding one cycle of the sampling clock signal.

7. The DLL circuit as claimed in claim 1, further comprising:
   a duty detecting circuit detecting a duty of the second clock signal; and
   a duty correction circuit correcting a duty of the second clock signal based on a detection result by the duty detecting circuit, wherein
   the antialiasing circuit prohibits the duty correction circuit to correct the duty of the second clock signal, in response to a fact that the jitter component included in the first clock signal is equal to or higher than the predetermined frequency.

8. The DLL circuit as claimed in claim 7, wherein the duty correction circuit includes a second delay line that adjusts the duty of the second clock signal by delaying one of edges of the first clock signal, and a second counter circuit that sets a delay amount of the second delay line, and
   the antialiasing circuit prohibits the second counter circuit to update its count value based on the duty detecting circuit, in response to a fact that the jitter component included in the first clock signal is equal to or higher than the predetermined frequency.

9. The DLL circuit as claimed in claim 1, wherein the phase detecting circuit determines the phase of the first clock signal by comparing a third clock signal obtained by delaying the second clock signal and the first clock signal.

10. A semiconductor device comprising:
    a DLL circuit including
    a first delay line delaying a first clock signal to generate a second clock signal,
    a first counter circuit setting a delay amount of the first delay line,
    a phase detecting circuit generating a phase determination signal based on a phase of the first clock signal, the phase detecting circuit determining the phase of the first clock signal by comparing a third clock signal obtained by delaying the second clock signal and the first clock signal, and
    an antialiasing circuit prohibiting the first counter circuit to update its count value based on the phase determination signal, in response to a fact that a jitter component included in the first clock signal is a predetermined frequency or more;
    an output buffer outputting an external output signal synchronously with the second clock signal; and
    a replica buffer having substantially the same circuit configuration as that of the output buffer, and outputting the third clock signal synchronously with the second clock signal.

11. The semiconductor device as claimed in claim 10, wherein the antialiasing circuit determines whether the first counter circuit can update its count value, based on the phase determination signal.

12. The semiconductor device as claimed in claim 11, further comprising a frequency dividing circuit generating a sampling clock signal by N-frequency dividing the first clock signal, wherein
    the first counter circuit updates its count value synchronously with the sampling clock signal, and
    the antialiasing circuit determines whether the first counter circuit can update its count value, based on at least a part of the phase determination signal during one cycle of the sampling clock signal.

13. The semiconductor device as claimed in claim 12, wherein the antialiasing circuit permits the first counter circuit to update its count value, in response to a fact that the phase determination signal during one cycle of the sampling clock signal is a same value at more than N/2 times consecutively.

14. The semiconductor device as claimed in claim 12, wherein the antialiasing circuit permits the first counter circuit to update its count value, in response to a fact that the phase determination signal during one cycle of the sampling clock signal is all at the same value.

15. The semiconductor device as claimed in claim 13, wherein the antialiasing circuit permits the first counter circuit to update its count value, in response to a fact that the phase determination signal is at the same value during a period exceeding one cycle of the sampling clock signal.

16. The semiconductor device as claimed in claim 10, wherein the phase detecting circuit determines the phase of the first clock signal by comparing a third clock signal obtained by delaying the second clock signal and the first clock signal.

* * * * *